United States Patent
Tailliet

(10) Patent No.: US 9,312,012 B2
(45) Date of Patent: Apr. 12, 2016

(54) EEPROM PROGRAMMING WITH FIRST AND SECOND PROGRAMMING MODES

(71) Applicant: STMicroelectronics (Rousset) SAS, Rousset (FR)

(72) Inventor: Francois Tailliet, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/632,785

(22) Filed: Feb. 26, 2015

(65) Prior Publication Data

US 2015/0243361 A1    Aug. 27, 2015

(30) Foreign Application Priority Data

Feb. 27, 2014  (FR) ...................................... 14 51599

(51) Int. Cl.
*G11C 16/14* (2006.01)
*G11C 16/04* (2006.01)
*G11C 16/12* (2006.01)
*G11C 16/34* (2006.01)

(52) U.S. Cl.
CPC ............ *G11C 16/14* (2013.01); *G11C 16/0433* (2013.01); *G11C 16/12* (2013.01); *G11C 16/349* (2013.01); *G11C 16/3495* (2013.01)

(58) Field of Classification Search
CPC ...................................................... G11C 16/14
See application file for complete search history.

(56) References Cited

U.S. PATENT DOCUMENTS

| | | | | |
|---|---|---|---|---|
| 5,844,841 | A * | 12/1998 | Takeuchi et al. | 365/185.03 |
| 8,873,293 | B1 * | 10/2014 | Ou et al. | 365/185.17 |
| 2006/0164887 | A1 | 7/2006 | Lin et al. | |
| 2007/0183205 | A1 * | 8/2007 | Lee | 365/185.18 |
| 2007/0253256 | A1 | 11/2007 | Aritome | |
| 2010/0124122 | A1 | 5/2010 | Jeong et al. | |
| 2010/0202216 | A1 * | 8/2010 | Byeon | 365/185.25 |

OTHER PUBLICATIONS

Bez et al., "Spice Model for Transient Analysis of EEPROM Cells," Journal de Physique, C4 Conference, Supplement to No. 9, vol. 49, pp. 677-680, Sep. 1988.

* cited by examiner

*Primary Examiner* — Douglas King
(74) *Attorney, Agent, or Firm* — Seed IP Law Group PLLC

(57) ABSTRACT

A method of programming an EEPROM, including: a first mode where a writing into cells is performed under a first voltage; and a second mode where the writing is performed under a second voltage smaller than the first one.

11 Claims, 3 Drawing Sheets

EEPROM PROGRAMMING WITH FIRST AND SECOND PROGRAMMING MODES

BACKGROUND

1. Technical Field

The present disclosure generally relates to electronic circuits and, more specifically, to EEPROM-type non-volatile memory circuits. The present disclosure more specifically relates to the programming of an EEPROM.

2. Description of the Related Art

EEPROM-type non-volatile memories are particularly common in electronic circuits and in integrated circuits. They are particularly used to store programs as well as configuration data or user data which should be non-volatilely stored.

The programming of an EEPROM-type memory is performed by applying, across the cell to be programmed, a voltage much greater than the read operating voltage (typically by a ratio of at least 3).

BRIEF SUMMARY

An embodiment overcomes all or part of the disadvantages of known EEPROMs, more particularly on programming thereof.

An embodiment provides an EEPROM programming technique which is fast, without adversely affecting the memory lifetime.

Thus, an embodiment provides a method of programming an EEPROM, comprising:

a first mode where a writing into cells is performed under a first voltage; and a second mode where the writing is performed under a second voltage, smaller than the first one.

According to an embodiment, the first and second voltages are greater than a third memory read voltage.

According to an embodiment, the first and second voltages are applied between a bit line and gates of transistors forming the memory nodes.

According to an embodiment, the number of programming operations in the first mode is limited to a number smaller, by a ratio of at least ten, preferably of at least one thousand, than the number of possible programming cycles in the second mode.

According to an embodiment, at least one erasing step is, in the first mode, carried out under a voltage greater than that used for an erasing in the second mode.

According to an embodiment, the number of times it is passed in the first mode is limited.

According to an embodiment, a given number of programming operations is performed in the first mode, after which only the second mode is used.

An embodiment also provides an EEPROM capable of implementing the above method.

According to an embodiment, the memory comprises a controller capable of delivering the first and second voltages.

An embodiment also provides an electronic circuit comprising a memory.

An embodiment also provides a system comprising:

at least one memory; and at least one circuit communicating with the memory to read data from it or write data into it.

The foregoing and other features and advantages will be discussed in detail in the following non-limiting description of specific embodiments in connection with the accompanying drawings.

DETAILED DESCRIPTION

Figure 1:
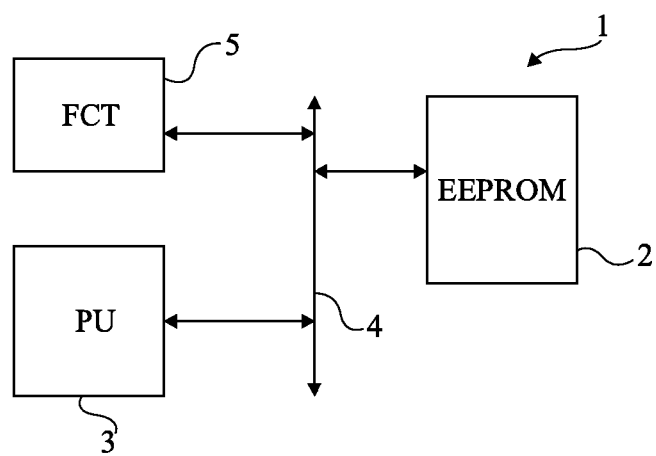
FIG. 1 shows an embodiment of an electronic system comprising an EEPROM.

The same elements have been designated with the same reference numerals in the different drawings. For clarity, only those steps and elements which are useful to the understanding of the described embodiments have been shown and will be detailed. In particular, the operation of an EEPROM has not been detailed, the described embodiments being compatible with the usual operation. Further, the different circuits and steps of addressing the different cells of a memory plane have not been detailed either, the described embodiments being here again compatible with usual solutions. When reference is made to a voltage relative to ground (0 volt), the same reference will indifferently designate the potential or the voltage.

FIG. 1 schematically shows an example of a system 1 comprising a non-volatile memory 2 (EEPROM) of electrically programmable and erasable type. Such a system generally comprises at least one processing unit 3 (PU) capable of communicating, over one or a plurality of control, address, and data buses 4, with memory 2 as well as, most often, with other circuits. In the example of FIG. 1, a block 5 (FCT) symbolizing other electronic functions capable of being implemented by the system has been shown. These functions may also have access to memory 2. The system and the electronic circuits that it comprises include many other elements such as input/output interfaces, other volatile and non-volatile memories, etc.

Figure 2:
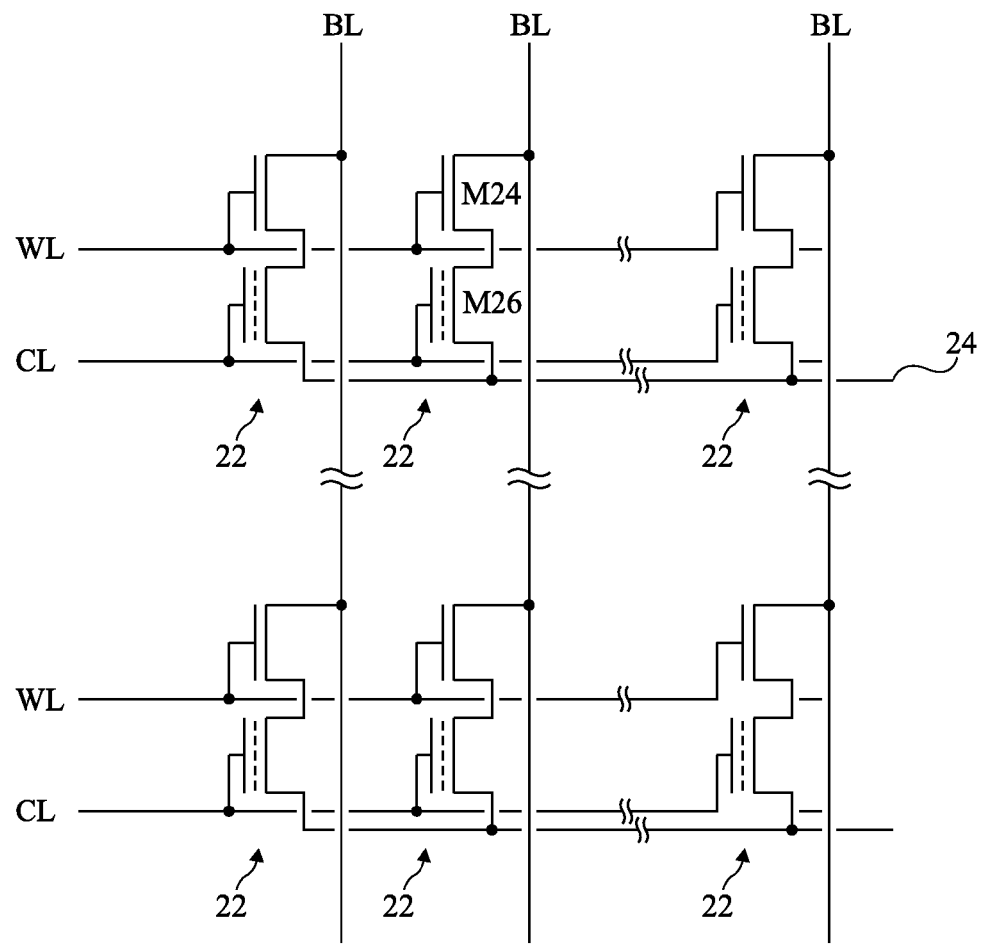
FIG. 2 shows the equivalent electric diagram of an EEPROM plane.

FIG. 2 is a simplified representation of an EEPROM. In FIG. 2, only the memory plane, that is, the matrix of memory cells 22, has been illustrated. A cell 22 is typically formed of a first selection transistor M24 in series with a second transistor M26 forming the memory node between a bit line BL and a terminal 24. Generally, terminal 24 is grounded during read and erase operations. During a programming, it is either at a floating potential (high impedance) or at a potential of a few volts to avoid the flowing of a current in transistor M26. The gate of transistor M24 is connected to a word line WL forming a selection line. The gate of transistor M26 is connected to a control line CL used during memory programming phases. Typically, bit lines BL are arranged in a first direction (for example, the column direction) while word and control lines WL and CL are arranged in a second direction (for example, in rows). The memory cell state is stored in the gate of transistor M26 forming the memory node.

Conventionally, control lines CL are either common to all the cells of a same word line WL, or common to a subset of cells of a word line (for example, of a byte). In this last case, the memory plane comprises circuits capable of switching lines CL.

In read mode, a relatively low voltage as compared with the programming voltage, typically in the order of one volt, is applied to bit lines BL. A memory controller then selects a word line WL to be read by raising its potential, the other lines being grounded, to turn on transistors M24 of the row. Line CL of the corresponding row is taken to a reference potential (for example, between 0.5 and 1.5 volt). According to the state of transistor M26 of a given cell, the turning-on of transistor M24 causes a discharge of the bit line potential to ground or generates no variation. The voltage variations at the bit line level are thus measured to determine respective states 0 or 1 of the cells in the row.

In programming mode (writing of a "1" into the cell), a positive voltage should be applied between line BL and the gate of transistor M26. Typically, line CL is grounded or connected to a negative potential while word line WL selects all the cells in the row. The bit lines BL where cells addressed by word line WL are to be programmed are then taken to a positive potential.

A programming is in practice preceded by an erasing of the memory (resetting of the cells to a state "0"). This erasing is performed by applying a negative voltage between bit line BL and control line CL.

The higher the programming voltage, the faster the programming. However, the higher this voltage, the faster the memory aging. A compromise is thus generally performed according to the endurance desired for the memory, that is, to the number of erase/write cycles that it is supposed to stand during the lifetime of the product. Typically, EEPROMs are supposed to stand a few millions of cycles and the programming voltage is selected accordingly.

The time to program data in an EEPROM is acceptable when the product is functional, that is, while it is being used. However, in an initial loading into the memory of a large amount of data, for example, for the loading of a program, be it on the manufacturing or in a product update step, the time for the programming is often considered as too long.

The inventor has observed that, in the lifetime of an EEPROM, the number of times where a general programming is desired (for example, an area of more than 16 kilobytes) is relatively small as compared with the number of programming operations for a small data range (for example, from one to 128 bytes). Typically, the desire for a general programming can be estimated as some ten or hundred times during the product lifetime.

It can then be considered that by performing the general programming under a higher voltage, the influence of programming cycles under a higher voltage than the normal programming becomes negligible on the memory aging. For example, considering a memory having a lifetime in the order of one million cycles under a given programming voltage, even if some ten full updates of this memory are performed with a higher programming voltage causing an aging which is ten, or even one hundred times faster, this amounts at most to carrying out from one hundred to one thousand cycles on this memory in wearing equivalence relative to the given programming voltage, which is negligible as compared with the millions of cycles that it can stand.

Thus, it is provided for the EEPROM to be able to operate according to programming modes at different voltage levels according to whether this programming relates to a normal use or a general update of the memory plane or of one or a plurality of pages thereof.

Figure 3:
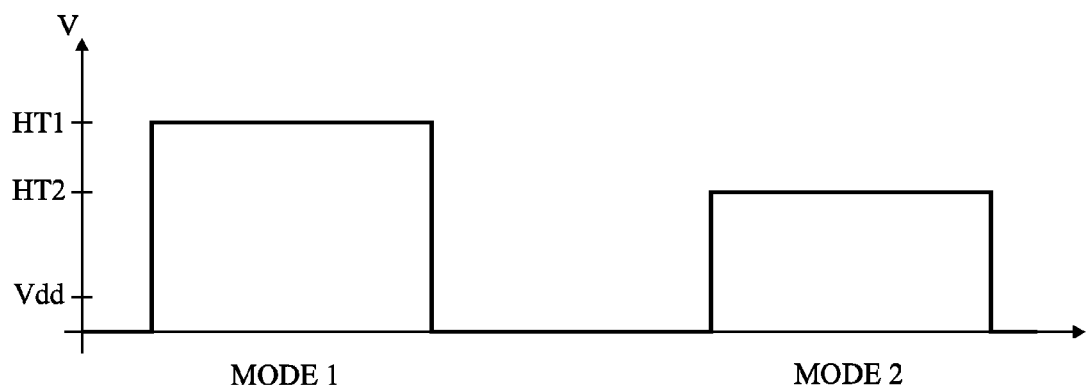
FIG. 3 illustrates an embodiment of the EEPROM programming method.

FIG. 3 is a very simplified diagram illustrating an embodiment of the programming method, and shows voltage levels V applied between bit line BL and control line CL of the cells to be programmed.

In a first operating mode (MODE1) corresponding, for example, to a programming of the entire memory plane, voltage V takes a first value HT1 much greater than the value present on the bit lines in read mode. In a second operating mode (MODE2) corresponding to a partial programming of the memory, voltage V takes a second value HT2 smaller than value HT1 while remaining greater than value Vdd. For example, voltage V1 is, in read mode, in the order of one volt, voltage Vdd is in the order of 3 volts, voltage HT1 is in the order of 16 volts, and voltage HT2 is in the order of 13 volts. The programming in the first mode causes a faster wearing of the memory, but also a faster programming than in second mode MODE2.

To implement this method, the EEPROM (its controller) is preferably modified to be able to switch from one programming mode to the other.

Figure 4:
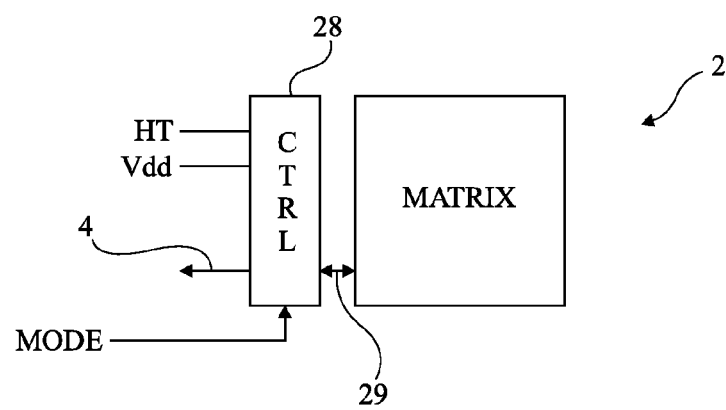
FIG. 4 is a simplified block diagram of an embodiment of an EEPROM.

FIG. 4 is a very simplified representation of an embodiment of a memory 2. Memory 2 comprises a cell matrix (MATRIX) associated with a memory controller 28 (CTRL). Controller 28 is in charge of organizing the access to the matrix cells, be it in read mode, in write mode, or in erase mode. Typically, controller 28 is powered with voltage Vdd, is connected to bus 4, and communicates with the bit, word, and control lines of the matrix. In the example illustrated in FIG. 2, the controller receives a voltage HT corresponding to the programming voltage. Voltage HT then takes one of its two values HT1 and HT2. As a variation, the generation of this voltage from level Vdd is performed in the actual memory circuit by means of a charge pump circuit.

Preferably, controller 28 receives a signal MODE indicative of the programming mode in which to operate. Signal MODE may be a simple bit taking value 0 or 1 according to the mode.

For example, memory controller 28 generates the memory plane control signals from a pair of parameters (programming voltage—application duration). According to an embodiment, the two possible durations which differ according to the programming mode are stored in controller 28. According to another embodiment, these data are transmitted with a write instruction.

According to a preferred embodiment, the memory programming is performed by a so-called split voltage method. This amounts to applying a positive potential to the bit line and a negative potential to control line CL.

Figure 5A:
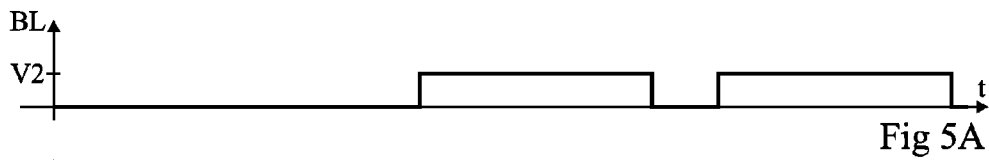
FIGS. 5A and 5B are timing diagrams illustrating the operation of the memory of FIG. 4 in a first mode.
Figure 5B:
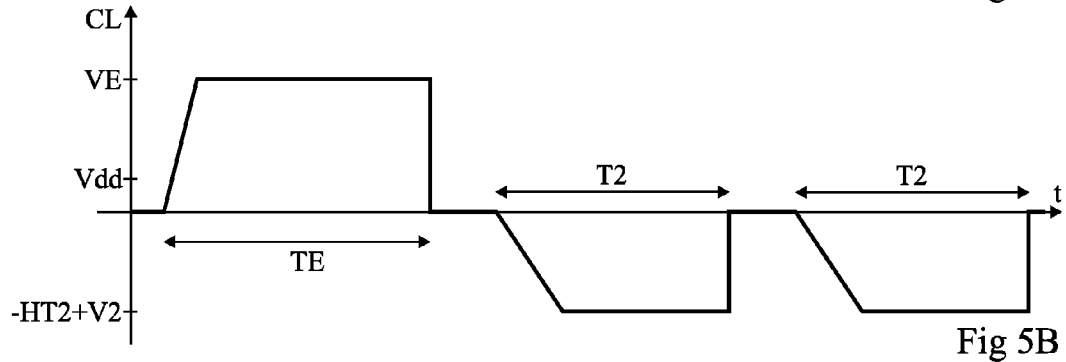

FIGS. 5A and 5B are timing diagrams illustrating the memory operation in the so-called normal mode (MODE2), that is, with a programming voltage selected according to the number of cycles expected during the memory lifetime. FIG. 5A illustrates the shape of the voltage applied to bit line BL. FIG. 5B illustrates the shape of the voltage applied to line CL.

A first step represents the erasing of the cell range where data are to be stored. Typically, the erasing is performed in full memory pages (areas). The erasing comprises taking control lines CL to a positive potential VE greater than potential Vdd, without addressing the bit lines, that is, leaving the bit line idle (grounded). Voltage VE is typically by a ratio of at least 3 relative to voltage Vdd, for example, in the order of some fifteen volts with respect to a voltage Vdd of a few volts. Voltage VE will be applied for a duration TE depending on the duration necessary to obtain the erasing. Duration TE is known for a given memory. According to the retained architecture, the erasing is performed in groups of bytes of a same page, in full pages, in groups of pages, or for the entire memory plane. Once the erasing has been performed, the data programming in the normal mode is performed by taking bit line BL to a potential V2 and control line CL to a potential −HT2+V2. Thus, voltage V between bit lines and control lines effectively has a value HT2. As a specific embodiment, potential V2 is a few volts and voltage −HT2+V2 is in the order of −10 volts with respect to ground. The programming steps are repeated for each word line. In the example of FIGS. 5A and 5B, two steps have been illustrated. It is assumed that a programming under voltage HT2 takes a time T2.

Figure 6A:
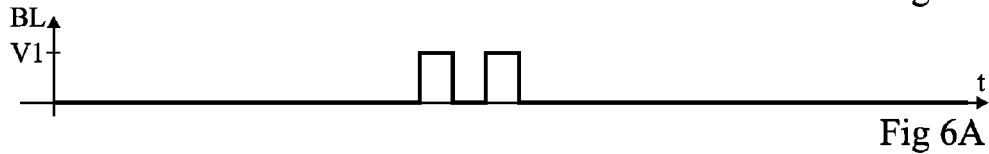
FIGS. 6A and 6B illustrate in timing diagrams the operation of the memory of FIG. 4 in a second mode.
Figure 6B:
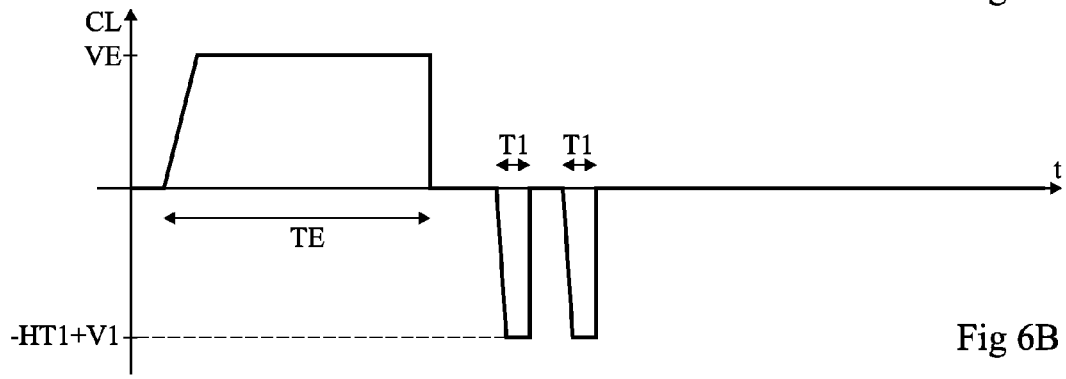

FIGS. 6A and 6B illustrate, in the form of timing diagrams, a programming in the so-called general mode (MODE1). FIG. 6A shows the shape of the potential on bit line BL. FIG. 6B shows the shape of the potential imposed on line CL.

After an erasing step similar, in this example, to the erasing step of FIGS. 5A and 5B, the programming is performed for the entire memory plane or for pages thereof by applying a potential V1 on bit line BL and a potential −HT1+FV1 on line CL, so that voltage V between the bit line and the control line takes value HT1. It is assumed that a programming under voltage HT1 takes a time T1.

Programming periods T1 and T2 are expressed for the maximum amount of data capable of being programmed in a single run, for example, in rows, in areas, in pages. It should be noted that, for a given entity (row, area, page, pane), voltage HT1 being greater than voltage HT2, period T1 is shorter than period T2.

To highlight this aspect, it has been arbitrarily assumed that the reference unit was the same in FIGS. 5A, 5B and in FIGS. 6A, 6B. In practice, the global mode will be reserved to the programming of large entities (preferably, page or plane).

Figure 7A:
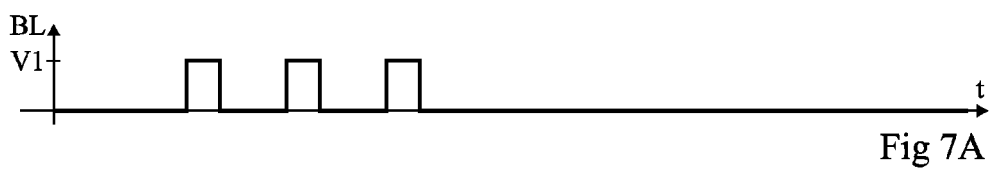
FIGS. 7A and 7B illustrate, in timing diagrams, a variation of the embodiment of FIGS. 6A and 6B.
Figure 7B:
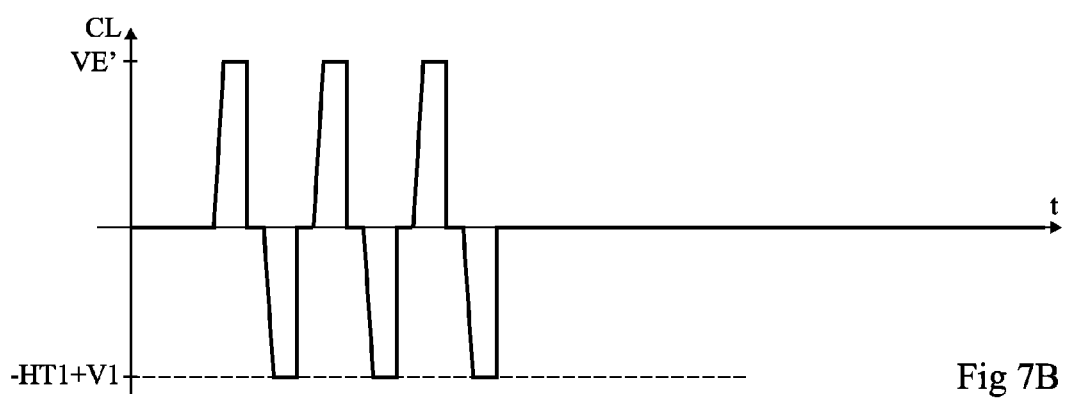

FIGS. 7A and 7B are timing diagrams respectively showing an example of shape of the potential of bit line BL and of the potential of control line CL according to another embodiment.

It is here provided not to erase the memory plane entirely before a programming operation, but rather to erase it page by page by applying a positive voltage VE' greater than voltage VE, to accelerate the erasing.

Different embodiments can be envisaged according to the memory characteristics. For example, the programming mode may be selected by an opcode capable of being indefinitely activated during the memory lifetime, or this possibility may be inhibited beyond a number of activations to preserve the memory lifetime. According to another example, a number of first programming operations are automatically in the first mode and the memory definitively switches afterwards to the second mode. The number of first programming operations is for example controlled by a counter in a non-volatile memory. According to still another embodiment, the number of programming operations may be counted per concerned memory sector or at the memory plane level.

An advantage of the described embodiments is that it is now possible to rapidly program an EEPROM to program full pages without adversely affecting the lifetime thereof.

The described embodiments are particularly advantageous in products allowing a factory programming or updates of large amounts of data at once.

Various embodiments have been described. Various alterations, modifications, and improvements will occur to those skilled in the art. In particular, the practical implementation of the described embodiments, such as for example the determining of times T1 and T2 during which to apply the programming voltages, is within the abilities of those skilled in the art based on the functional indications given hereabove. Further, the number of programming operations in the first mode may be provided to be limited to a number smaller, by a ratio of at least ten, preferably of at least one thousand, than the number of possible programming cycles in the second mode.

Such alterations, modifications, and improvements are intended to be part of this disclosure, and are intended to be within the spirit and the scope of the present disclosure. Accordingly, the foregoing description is by way of example only and is not intended to be limiting. The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method, comprising:
    programming an EEPROM, the programming including:
        selecting one of first and second programming modes depending on an amount of input data desired to be programmed;
        in response to selecting the first programming mode, writing the input data into memory cells of the EEPROM using a first programming voltage;
        in response to selecting the second programming mode, writing the input data into the EEPROM using a second programming voltage, smaller than the first programming voltage; and
        determining that a given number of programming operations have been performed in the first programming mode, and
        limiting programming operations to the second programming mode in response to determining that the given number of programming operations have been performed in the first programming mode.

2. The method of claim 1, wherein the first and second voltages are greater than a memory read voltage used to read data from the EEPROM.

3. The method of claim 1, wherein the first and second programming voltages are applied between a bit line and gates of transistors forming the memory cells.

4. The method of claim 1, comprising limiting programming operations in the first programming mode to a number smaller, by a ratio of at least ten, than a number of possible programming operations in the second programming mode.

5. The method of claim 1, comprising:
    erasing a first portion of the EEPROM in a first erasing mode carried out using a first erase voltage; and
    erasing a second portion of the EEPROM in a second erasing mode carried out using a second erase voltage less than the first erase voltage.

6. An EEPROM, comprising;
    a memory matrix of EEPROM memory cells; and
    a controller configured to:
        program an EEPROM using steps including:
            selecting one of first and second programming modes depending on an amount of input data desired to be programmed;
            in response to selecting the first programming mode, writing the input data into memory cells of the EEPROM using a first programming voltage; and
            in response to selecting the second programming mode, writing the input data into the EEPROM using a second programming voltage, smaller than the first programming voltage;

determine that a given number of programming operations have been performed in the first programming mode, and limit programming operations to the second programming mode in response to determining that the given number of programming operations have been performed in the first programming mode.

7. A system comprising:

an EEPROM, including:

a memory matrix of EEPROM memory cells; and a controller configured to:

program an EEPROM using steps including:

selecting one of first and second program modes depending on an amount of input data desired to be programmed;

in response to selecting the first programming mode, writing the input data into memory cells of the EEPROM using a first programming voltage; and in response to selecting the second programming mode, writing the input data into the EEPROM using a second programming voltage, smaller than the first programming voltage;

determine that a given number of programming operations have been performed in the first programming mode, and limit programming operations to the second programming mode in response to determining that the given number of programming operations have been performed in the first programming mode; and at least one circuit configured to communicate with the me EEPROM to read data from the memory matrix or write data into the memory matrix.

8. A method, comprising programming an EEPROM, the programming including:

selecting one of first and second programming modes depending on an amount of input data desired to be programmed;

in response to selecting the first programming mode, writing the input data into memory cells of the EEPROM using a first programming voltage; and in response to selecting the second programming mode, writing the input data into the EEPROM using a second programming voltage, smaller than the first programming voltage; and limiting programming operations in the first programming mode to a number smaller, by a ratio of at least ten, than a number of possible programming operations in the second programming mode.

9. The method of claim 8, wherein the first and second voltages are greater than a memory read voltage used to read data from the EEPROM.

10. The method of claim 8, wherein the first and second programming voltages are applied between a bit line and gates of transistors forming the memory cells.

11. The method of claim 8, comprising:

erasing a first portion of the EEPROM in a first erasing mode carried out using a first erase voltage; and erasing a second portion of the EEPROM in a second erasing mode carried out using a second erase voltage less than the first erase voltage.

\* \* \* \* \*